United States Patent
MacPeak et al.

(10) Patent No.: US 11,239,346 B2
(45) Date of Patent: Feb. 1, 2022

(54) SPLIT GATE MEMORY CELL FABRICATION AND SYSTEM

(71) Applicant: Texas Instruments Incorporated, Dallas, TX (US)

(72) Inventors: John Howard MacPeak, Garland, TX (US); Douglas Ticknor Grider, McKinney, TX (US); Brian K. Kirkpatrick, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 92 days.

(21) Appl. No.: 16/426,222

(22) Filed: May 30, 2019

(65) Prior Publication Data

US 2020/0381541 A1 Dec. 3, 2020

(51) Int. Cl.
| | | |
|---|---|---|
| H01L 29/66 | (2006.01) | |
| H01L 21/311 | (2006.01) | |
| H01L 29/40 | (2006.01) | |
| H01L 27/11546 | (2017.01) | |
| H01L 29/423 | (2006.01) | |
| H01L 21/28 | (2006.01) | |

(52) U.S. Cl.
CPC .. *H01L 29/66825* (2013.01); *H01L 21/31111* (2013.01); *H01L 21/31116* (2013.01); *H01L 27/11546* (2013.01); *H01L 29/401* (2013.01); *H01L 29/40114* (2019.08); *H01L 29/42328* (2013.01)

(58) Field of Classification Search
CPC ......... H01L 29/66825; H01L 21/31111; H01L 21/31116; H01L 29/401; H01L 21/823462; H01L 27/11546; H01L 29/42328; H01L 29/40114
See application file for complete search history.

(56) References Cited

U.S. PATENT DOCUMENTS

| | | | | |
|---|---|---|---|---|
| 5,989,962 A | * | 11/1999 | Holloway | H01L 27/088 224/542 |
| 6,033,943 A | * | 3/2000 | Gardner | H01L 21/823857 257/E21.639 |
| 6,146,948 A | * | 11/2000 | Wu | H01L 21/823462 257/E21.625 |
| 2002/0013067 A1 | * | 1/2002 | Taniguchi | H01L 21/32 438/787 |

* cited by examiner

Primary Examiner — Ermias T Woldegeorgis
(74) Attorney, Agent, or Firm — Andrew R. Ralston; Charles A. Brill; Frank D. Cimino (57) ABSTRACT

A method of forming an integrated circuit relative to a wafer comprising a semiconductor substrate. The method first forms a first dielectric layer having a first thickness and along the substrate, the first forming step comprising plasma etching the wafer in a first substrate area and a second substrate area and thereafter growing the first dielectric layer in the first substrate area and the second substrate area. After the first step, the method second forms a second dielectric layer having a second thickness and along the substrate in the second substrate area, the second thickness less than the first thickness, the second forming step comprising removal of the first dielectric layer in the second substrate area without plasma and until a surface of the substrate is exposed and growing the second dielectric layer in at least a portion of the surface.

20 Claims, 8 Drawing Sheets

SPLIT GATE MEMORY CELL FABRICATION AND SYSTEM

BACKGROUND

The example embodiments relate to semiconductor fabrication, for example with respect to split gate memory cells.

Flash memory is an improved version of electrically erasable, programmable read-only memory (EEPROM). Flash memory is used in a variety of applications that require programmability with no loss of memory data during power down, also referred to as non-volatility. Related devices, accordingly, are typically referred to as non-volatile memory (NVM) devices. One type of flash memory is split-gate flash memory, where each memory storage cell is sometimes considered a two transistor (2 T) device, due to two separate gates in connection with the same path between source and drain. One of the gates is actually a gate pairing, including a control gate and a floating gate. The other gate is an access gate separated by a dielectric from the gate pairing, where the access gate is also sometimes referred to by other terms, such as a pass gate or select gate. Both the floating gate and the access gate are separated by respective dielectrics (e.g., oxides) from an underlying semiconductor substrate. The floating gate stores charge, received by one of various different programming methods, as further influenced by the control gate and access gate. Multiple split-gate cells may be arranged in an array having rows and columns, or word lines and bit lines, either according to common memory convention. For example, word lines are often connected across access gates of devices, while bit lines connect to the cell channel.

Various factors, such as scaling of split-gate flash cells, have decreased the access gate oxide thickness from thicker high-voltage oxides to thinner low-voltage (e.g., core) oxides. The thinner (lower voltage) oxide introduces a new vulnerability to the data state stored in the cell during programming or once the data is so stored, particularly when the cell is part of a memory array and while programming other cells in the same array. For example, during an access to a row of cells, where voltage is applied to a word line connected to the access gate of each cell in the line (or row), charge can tunnel from the access gate to the channel below the floating gate, and such charge can pass further via injection to the floating gate itself, for example by hot electron injection (HEI). Such a possibility is sometimes referred to in the art as a programming disturb mechanism, as it undesirably or unintentionally disturbs the transistor threshold voltage and correspondingly alters its data state. Or, short of fully changing state, a disturb can alter the data state to indeterminate, rendering it vulnerable to change full binary state (0 to 1, or 1 to 0) without a full and intended programming action. Intrinsic programming disturb performance is dependent on the gate oxide leakage. However, extrinsic fast disturb bits show much lower thermal activation energy, suggesting local gate oxide thinning in the passage of charge that may arise from earlier etching and resulting damage to the semiconductor substrate. Accordingly, example embodiments are provided herein that may improve on certain of the above concepts, as further detailed below.

SUMMARY

A method of forming an integrated circuit relative to a wafer comprising a semiconductor substrate. The method first forms a first dielectric layer having a first thickness and along the substrate, the first forming step comprising plasma etching the wafer in a first substrate area and a second substrate area and thereafter growing the first dielectric layer in the first substrate area and the second substrate area. After the first step, the method second forms a second dielectric layer having a second thickness and along the substrate in the second substrate area, the second thickness less than the first thickness, the second forming step comprising removal of the first dielectric layer in the second substrate area without plasma and until a surface of the substrate is exposed and growing the second dielectric layer in at least a portion of the surface.

Other aspects are also described and claimed.

DETAILED DESCRIPTION

Figure 1:
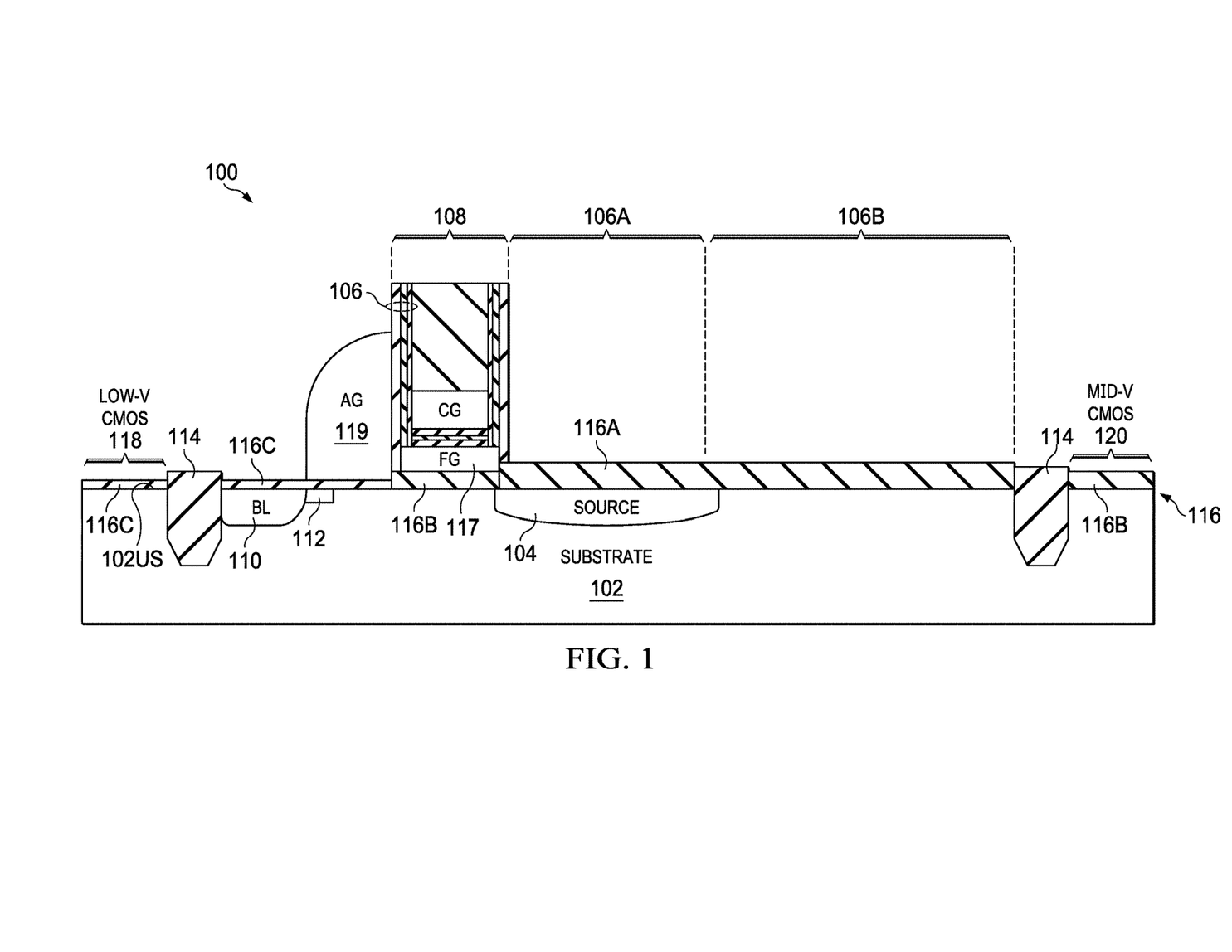
FIG. 1 is a cross-sectional view of partially constructed (in progress) split gate memory cell, which may be one cell of many cells and/or devices in an integrated circuit, but not necessarily drawn to scale.

FIG. 1 is a cross-sectional view of partially constructed (in progress) split gate memory cell 100, which may be one cell of many cells and/or devices in an integrated circuit. Memory cell 100 is illustrated in a stage of partial completion, to support an understanding of various example embodiment methods and structures detailed later, as those items lead to the result illustrated in FIG. 1. Further, various additional post-processing steps for completing the device may be included beyond the partial construction shown, and such steps, and the attendant structures, may be ascertained by one skilled in the art.

Cell 100 is formed in connection with a semiconductor substrate 102. Substrate 102 is generally a portion of a wafer, in connection with which a number of differing integrated circuit die are formed and then later separated and packaged. The semiconductor materials of substrate 102 may be various materials, including silicon, silicon-germanium, or other materials in the form of a bulk substrate or an epitaxial layer on a bulk substrate. Each integrated circuit die may include various circuitry, in addition to the illustrated cell 100.

Various regions are formed within substrate 102, with some of those regions, and techniques for forming them, known in the art. For example, a source (or drain) 104 is in substrate 102 in a portion of a central area 106A, shown to the right of a gate stack 108. The conductivity type of source 104, typically formed by a masked doping implant in substrate 102, is complementary to that of substrate 102, as determined by whether cell 100 is either an n-channel metal-oxide semiconductor (NMOS) or p-channel metal-oxide semiconductor (PMOS) device. On the opposite side of gate stack 108 relative to central area 106A, and within substrate 102, is an additional conductivity region 110, typically referenced in split gate memory cells as a bitline (BL) 110. BL 110 has the same conductivity type as source 104, and is also typically formed by a masked doping implant in substrate 102. Optional, yet often desired, is a lightly-doped drain (LDD) region 112 formed inward of BL 110, toward the direction of source 104, also typically formed by a masked doping implant (pocket implants also may be included). In an outward direction relative to gate stack 108, either beyond BL 110 or beyond a distal area 106B, isolating structures 114 may be formed. Shallow trench isolation (STI) may be used to form isolating structures 114, as dielectrics extending downward into substrate 102. Such isolation permits other devices to be formed that share substrate 102, but that may serve functions other than cell 100. Additionally, some of the process steps used to form the non-volatile functions of cell 100 also may concurrently form structure of these other devices.

A dielectric layer 116, such as an oxide, is shown generally along most of an upper surface 102US of substrate 102. Dielectric layer 116 has different thicknesses, or may include more than one layer that combine to provide a different thickness, in different areas along upper surface 102US. Accordingly, the differing-thickness dielectric portions are shown as dielectric section 116A in central and distal areas 106A and 106B, dielectric section 116B in gate stack 108 between a floating gate FG 117 and substrate 102, and dielectric section 116C in the area beyond gate stack 108 up to the isolating structure 114 that is adjacent BL 110, so that in part dielectric section 116C is between an access gate AG 119 and substrate 102. In an example embodiment, dielectric section 116A has a larger thickness than dielectric section 116B, and dielectric section 116B has a larger thickness than dielectric section 116C. Given these relative thicknesses, dielectric section 116C may be referred to herein as a thin dielectric or thin oxide. Accordingly and as detailed later, dielectric section 116C may support the benefits of a thin oxide in connection with NVM functionality of cell 100 and also may be concurrently formed beyond one or more of isolating structures 114 as a portion of other devices. In any event, example embodiments include a method of constructing cell 100, whereby dielectric section 116C achieves the relative thinness shown and may reduce the possibility of program disturb that may arise from prior art technique used to create thin oxides. For example, such techniques may use a plasma etch down to the substrate and subsequent re-growth in order to form thin dielectrics. That plasma etch may damage upper surface 102US and some depth within substrate 102, in a manner that can result in local thinning of a re-grown dielectric and also the area/interface where the thin oxide meets one or both of the oxide layer 116B beneath gate stack 108 and the oxide(s) on the adjacent gate stack 108 sidewall. Such damage creates possible program disturb, as charge may leak (or tunnel) and thereby disturb either the data state held by a floating gate FG 117, or the energy level needed to change the state, in gate stack 108. Indeed, since NVM cell data often is interpreted to equate a no-charge state as a binary 1, then charged leaked into the cell can cause the cell data state to be mistakenly interpreted as a binary 0, thereby presenting an erroneous result.

As introduced above, devices other than NVM cells also may be formed in connection with substrate 102. For example, while FIG. 1 illustrates an NVM cell 100 between isolating structures 114, outside the area between those structures may be formed other devices, some of which implement one or more of the dielectric thicknesses of sections 116A, 116B, and 116C. For example, a number of NVM cells may form a bit array on substrate 102 between isolating structures 114, while outside of isolating structures 114 may be located a low-voltage complementary metal-oxide semiconductor (CMOS) section 118 of transistors. Within CMOS section 118, each transistor gate may be separated by a gate dielectric from substrate 102, with that gate dielectric formed from the thinnest dielectric sections available from the process of constructing cell 100. Hence, additional thin dielectric sections 116C in such a low-voltage CMOS section 118 are formed concurrently with the thin dielectric section 116C of cell 100. As another example, outside of isolating structures 114 may be located a medium-voltage CMOS section 120 of transistors. These transistors may have a gate dielectric formed from the medium dielectric available from the process of constructing cell 100. Hence, the medium dielectric section 116B in a medium-voltage CMOS section 120 may be formed concurrently with the medium thickness dielectric section 116B of cell 100. Likewise, for even higher voltage devices (not shown), thick dielectric sections may be formed concurrently with thick dielectric section 116A of cell 100.

Figure 2:
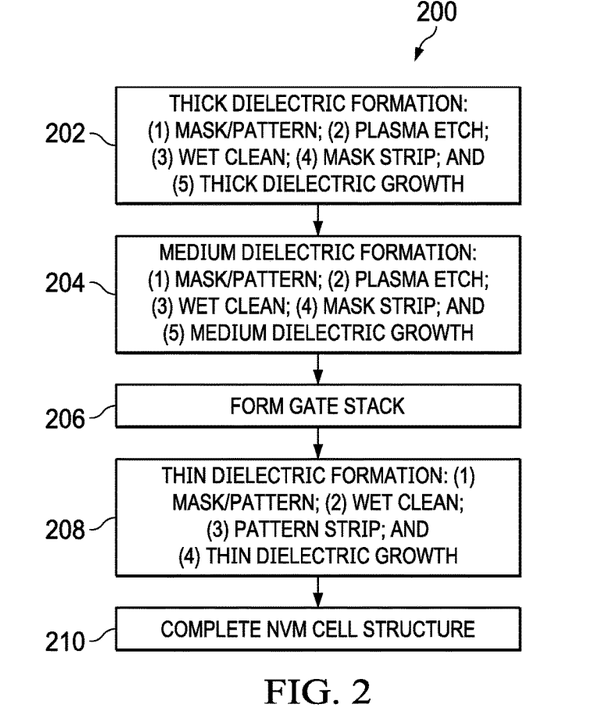
FIG. 2 illustrates an example embodiment flow chart method for fabricating the split-gate flash cell of FIG. 1
Figure 3A:
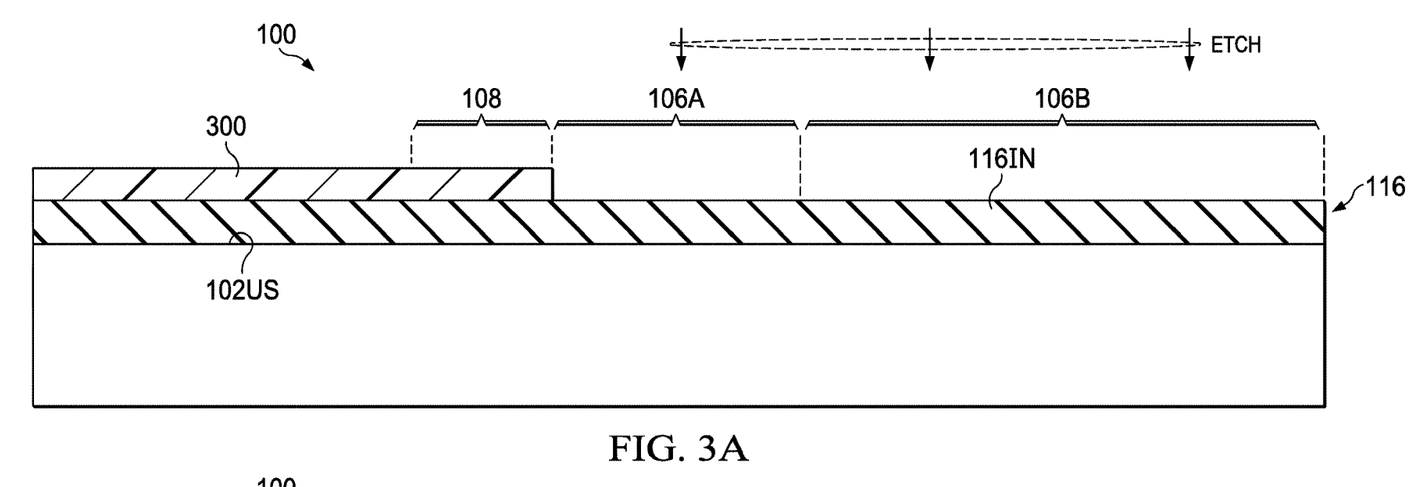
FIGS. 3A through 3I illustrate cross-sectional views of a split-gate flash cell corresponding to various of the steps of the method of FIG. 2, but not necessarily drawn to scale.

FIG. 2 illustrates a flow chart method 200 as an example embodiment for fabricating split-gate flash cell 100 of FIG. 1, with various of the method 200 steps further illustrated by corresponding cross-sectional views in FIGS. 3A through 3I. Further, various steps may be re-arranged and other steps added. For example, certain layers are shown as formed (e.g., patterned and etched), while other layers may be included or may exist prior to or between illustrated steps—indeed, a semiconductor wafer surface may initially support an oxide film (e.g., 180 Å) 116IN as shown in FIG. 3A, before other layers are grown or removed, so layering described herein can be cumulative to such an initial layer. Further, the split-gate flash cell can be based on either NMOS or PMOS transistors. Lastly, disclosed embodiments can be applied to NOR or NAND-based flash memory designs.

Figure 3B:
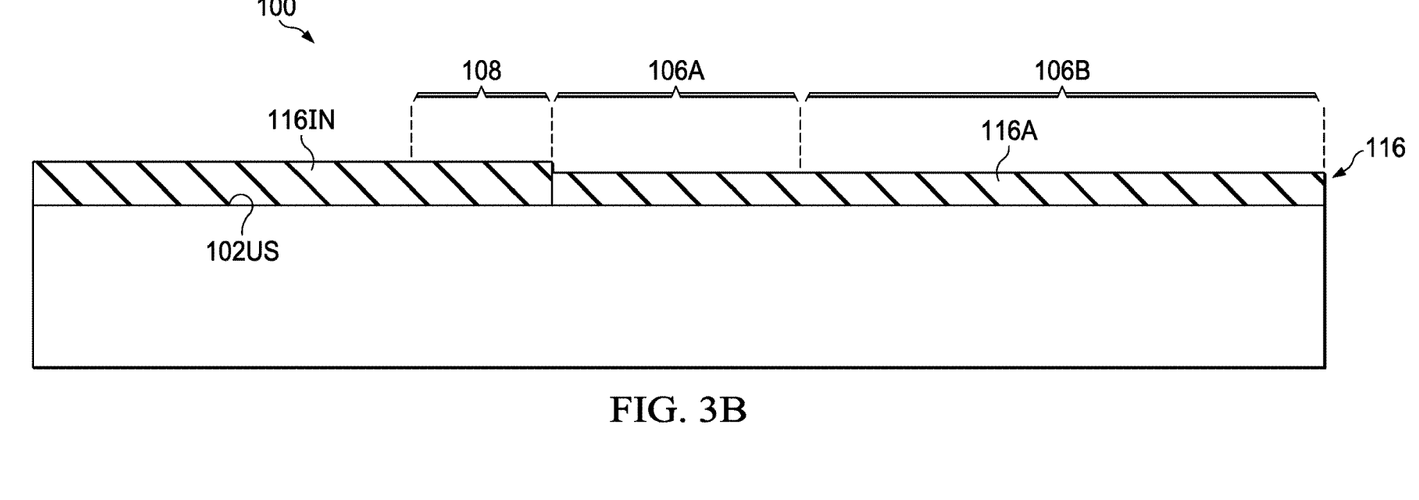

Method 200 commences with a step 202, in which a thick dielectric layer (e.g., gate oxide) is formed, where certain aspects of step 202 are shown in FIG. 3A, and the resultant thick dielectric layer section 116A is shown in FIG. 3B. In step 202, semiconductor substrate 102 is provided, and a mask 300 is patterned over initial oxide film 116IN, with a mask opening created in the area(s) where it is desired to form to form thick gate oxide regions on upper surface 102US of substrate 102. In the illustrated example, mask 300 covers film 116IN in areas other than central and distal areas 106A and 106B. Next, a plasma etch is performed, which directs a plasma to the unmasked regions of initial oxide film 116IN, so as to remove any undesired materials in those unmasked locations. Depending on the plasma etch techniques and chemistries, various oxide thickness and/or residual particles effects may remain/occur at surface 102US; for example, the plasma etch can occur to remove a portion of initial oxide film 116IN and until its oxide thickness is reduced to a certain threshold thickness (e.g., 55 Å), or alternatively the etch may be down to surface 102US. Further, following the plasma etch, a chemical wet clean may be performed (typically followed by a water rinse and dry cycle) to remove such oxide/particles and to reach or expose upper surface 102US. In a wet clean, a liquid phase cleaning solution is applied, possibly enhanced with some form of agitation. Next, the step 202 mask 300 is removed, which also may include subsequent cleaning steps, sometimes referred to as a semiconductor clean (SC) steps or steps. For example, an SC1 step may remove organics, while a subsequent SC2 step may remove metals, such as residue from the stripped mask or other metals. An example SC1 includes a combination of $NH_4OH:H_2O_2$:de-ionized water (DIW) in a dilution ratio of 1:1:5 to 1:1:50, at a temperature between room temperature and 65° C. An example SC2 includes a combination of $HCl:H_2O_2$:DIW in a dilution ratio of 1:1:5 to 1:1:600 (or 1:0:600), at a temperature between 50° C. and 70° C. Next, a dielectric layer is formed (e.g., dielectric growth) to a desired thickness, on any exposed areas of semiconductor, thereby creating the thick dielectric section 116A shown in FIG. 3B. By way of example, thick dielectric segment 116A may be in the range of 60 to 250 Å in thickness. At the same time, dielectric growth also will occur to a lesser extent on formerly-masked and now exposed dielectric (e.g., initial oxide film 116IN), but for purposes of drawing simplification, a thickness change is not shown there. Following step 202, method 200 continues to step 204.

Figure 3C:
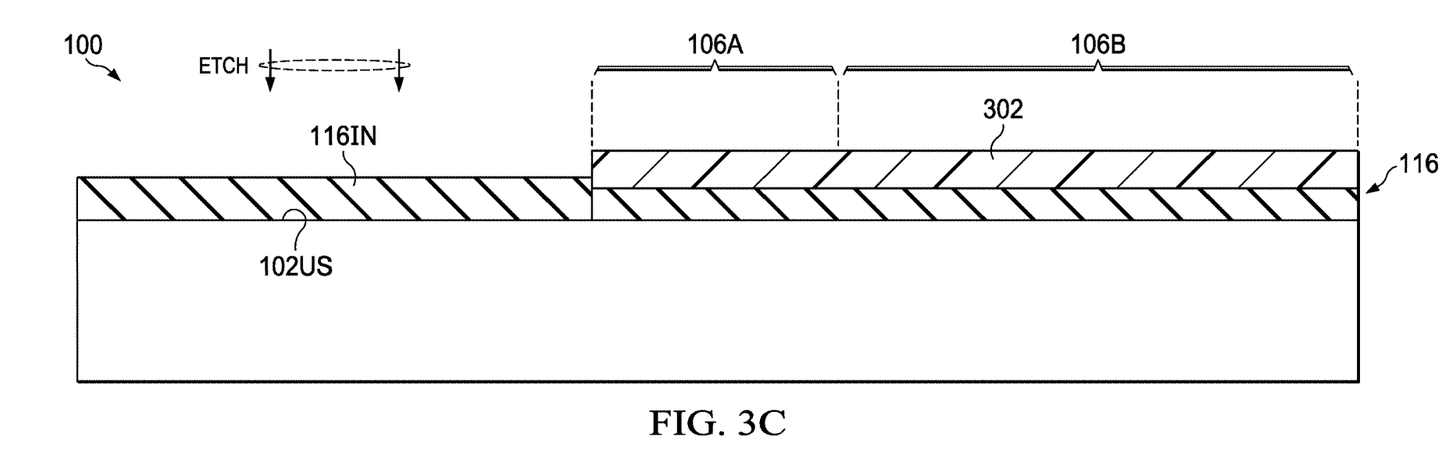
Figure 3D:
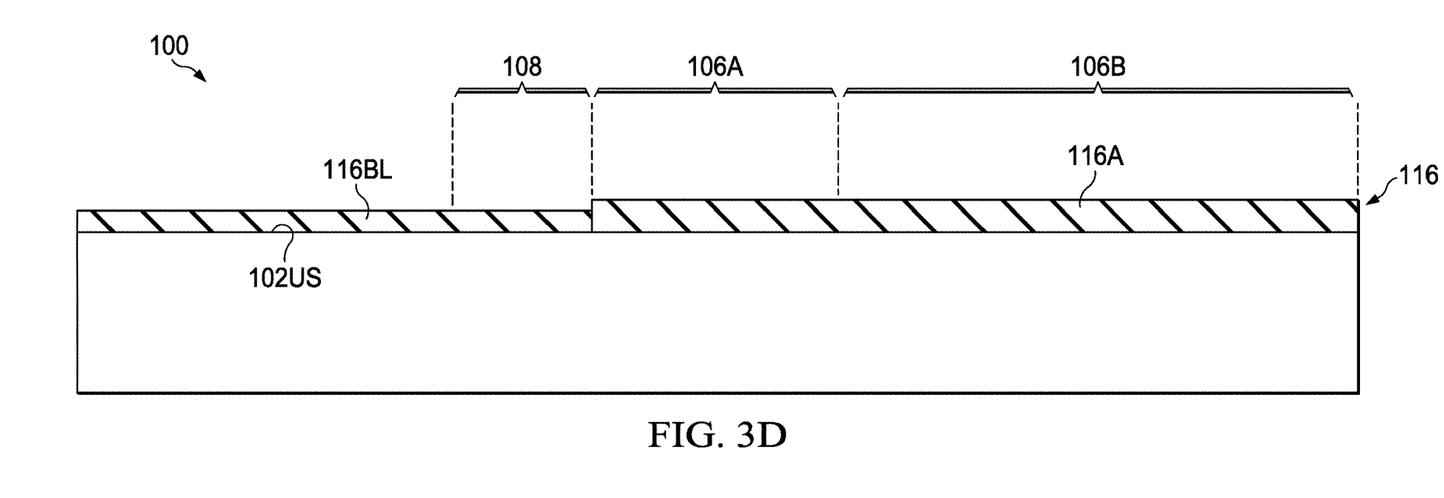

In step 204, a medium-thickness dielectric layer 116BL is formed (e.g., again, gate oxide growth), where an "L" is added in the reference indication of 116BL to denote that this is a layer (L) from which eventually a portion of it forms the above-introduced medium-thickness dielectric section 116B. Certain aspects of step 204 are shown in FIG. 3C, and the resultant medium-thickness dielectric layer 116BL is shown in FIG. 3D. In an example embodiment, medium-thickness dielectric layer formation follows the same steps as thick dielectric layer formation, scaled to create a less thick dielectric layer. Accordingly, from the structure of FIG. 3B, a mask 302 is patterned with a mask opening created in the area(s) where it is desired to form medium-thickness gate oxide regions on upper surface 102US. As appreciated later, however, those regions include both the areas where medium-thickness gate oxides are desired, and further also areas where thin-thickness gate oxides are desired. In the illustrated example, therefore, mask 302 covers thick dielectric 116A, leaving open areas other than central and distal areas 106A and 106B, which as shown in FIG. 1 include: (1) central area 108 in which medium-thickness dielectric section 116B is located; and (2) also the area beyond gate stack 108 up to the isolating structure 114 that is adjacent BL 110, where thin dielectric section 116C is located. Next as shown in FIG. 3C, a plasma etch is performed, which directs a plasma to the unmasked regions, which in the illustrated example are the remaining portion of initial layer 116IN. The plasma etch is timed to remove an upper portion of the unmasked regions (of initial layer 116IN), again for example by leaving at least some threshold thickness (e.g., 55 Å) of that dielectric along upper surface 102US, or again alternatively the etch may be down to surface 102US. Following the plasma etch, a chemical wet clean may be performed to remove remaining unmasked oxide/particles. Next, the step 204 masking (e.g., mask 302) is removed which, like step 202, may include an SC1 organic-removal and SC2 metal removal step. Lastly, a dielectric layer is formed (e.g., grown) to a desired thickness, on any exposed areas of semiconductor, thereby creating the medium-thickness dielectric section 116B in FIG. 3D. By way of example, medium-thickness dielectric section 116B may in the range of 35 to 60 Å in thickness. Following step 204, method 200 continues to step 206.

Figure 3E:
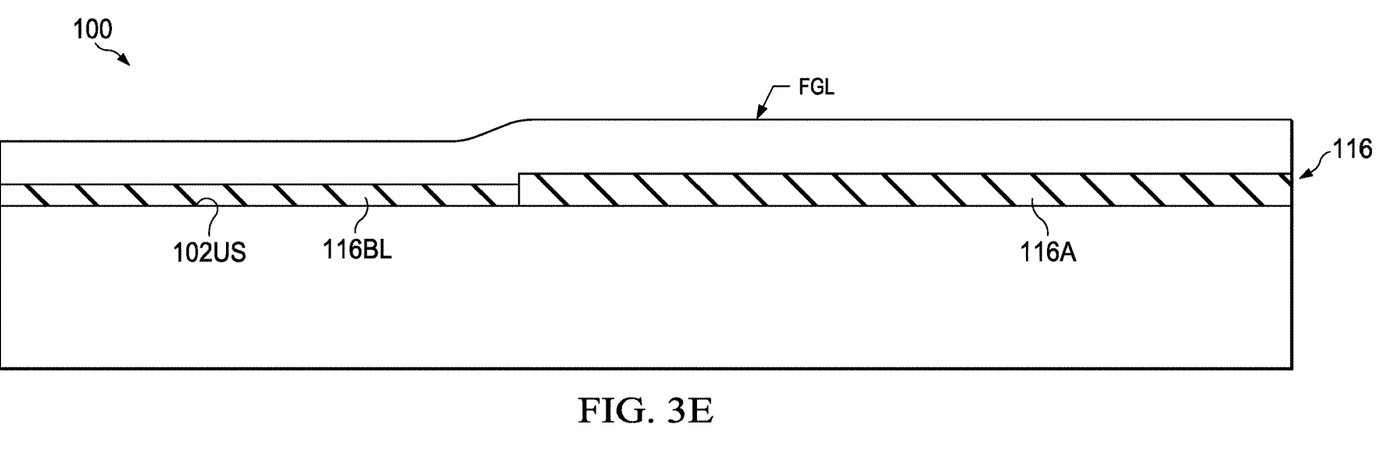
Figure 3F:
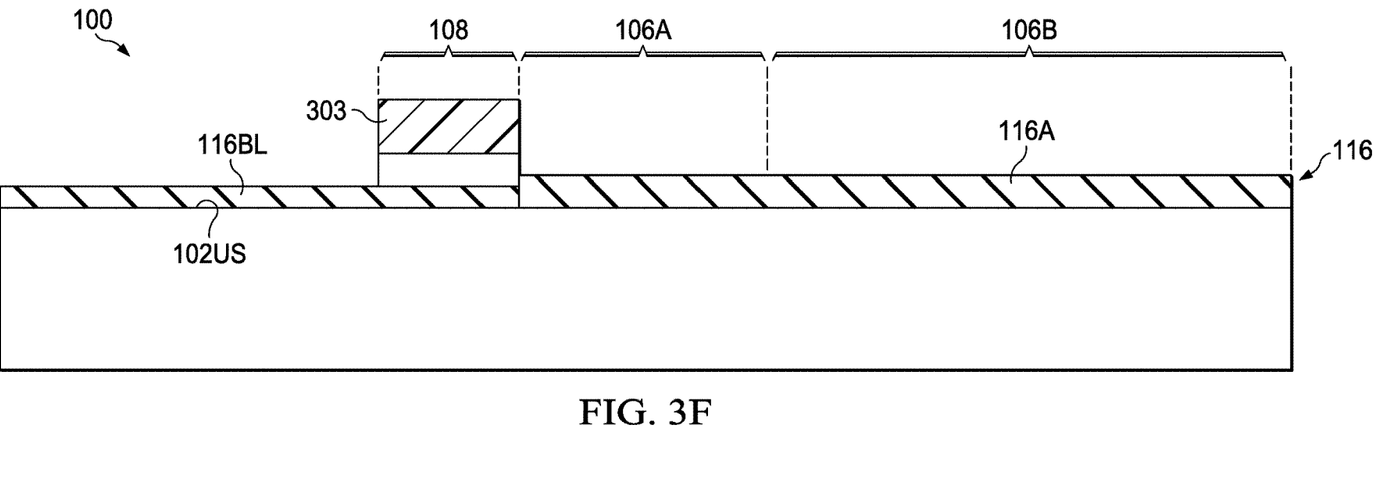
Figure 3G:
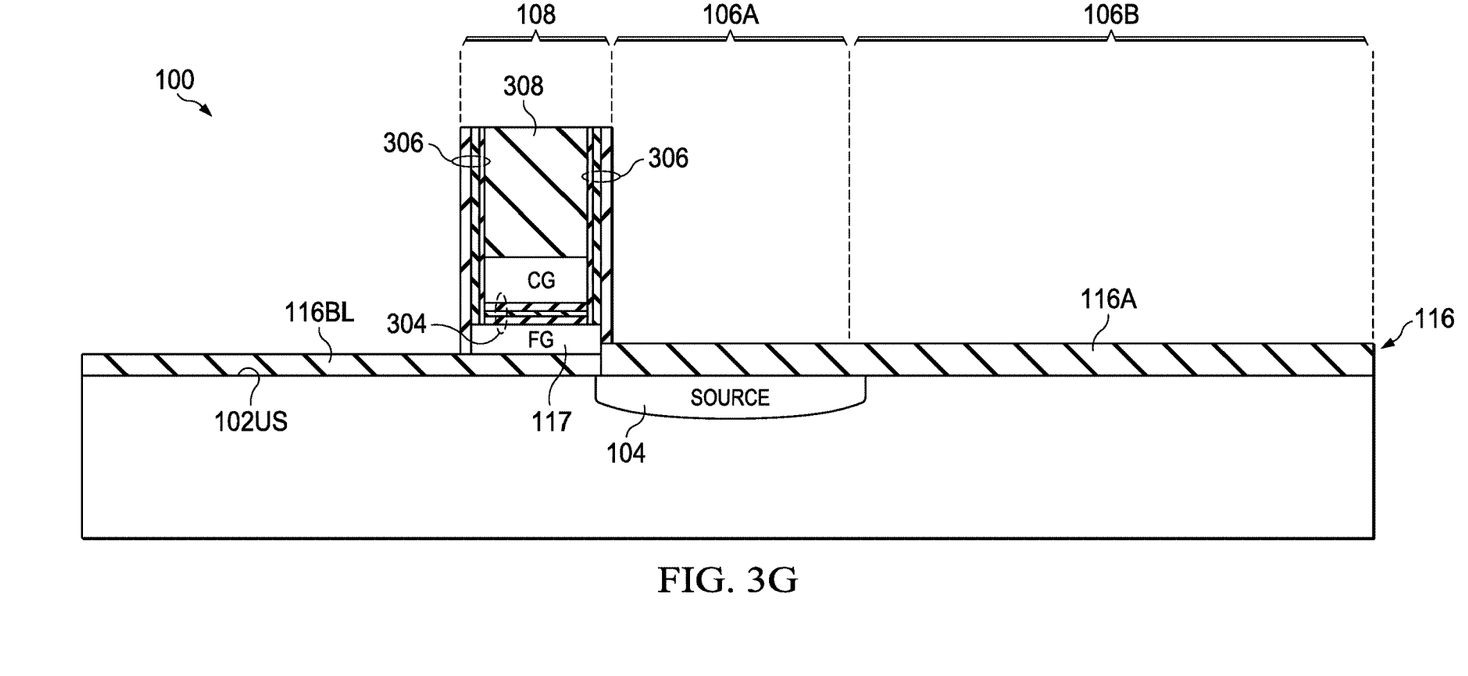

In step 206, gate stack 108 of FIG. 1 is formed, with the process of formation shown in FIGS. 3E through 3G. With thick and medium thickness dielectrics having been formed, a conductive (e.g., doped polysilicon) floating gate layer FGL is formed over those dielectrics (see, FIG. 3E). This same conductive layer may be used to form gate structures elsewhere with respect to substrate, beyond isolating structures 114 in FIG. 1. Next, a mask 303 is formed in the area where a floating gate is to be formed (see, FIG. 3F), and a gate etch is performed to remove floating gate layer FGL in any unmasked area(s), with the remaining portion thereof providing the gate stack floating gate FG 117. Once floating gate FG 117 is formed, mask 303 is removed and additional steps are performed to complete the gate stack, and also to self-align (e.g., implant) source 104, relative to floating gate FG 117 (and to another masking structure not shown), within substrate 102. Accordingly, and as shown in FIG. 3G, gate stack 108 includes a floating gate FG 117, separated by a medium-thickness dielectric layer 116BL, from substrate 102. One or more additional dielectric layers 304 are formed above floating gate FG 117, and a control gate CG is formed above those additional dielectric layers 304. Accordingly, dielectric layers 304 provide a dielectric stack between floating gate FG 117 and control gate CG. Sidewall dielectrics 306 also are formed along and/or aligned to the sidewalls of floating gate FG 117 and/or control gate CG, such that the length of sidewall dielectrics 306 are generally orthogonal to upper surface 102US (e.g., by extending within a range of 80 to 100 degrees relative to upper surface 102US, and simplifying the structure by assuming it has an approximately planar upper surface and an approximately planar sidewall geometry). Sidewall dielectrics 306 have a thickness in the range of 100 to 200 Å, so as to sufficiently isolate the later-formed access gate during programming. Indeed, contemporary processes have tended to thin these outer sidewall dielectrics below 120 Å as between the gate stack and its respective access gate AG 119 (see FIG. 1). Such sidewall dielectric thinning could create a potential disturb mechanism at or near the interface of the sidewall dielectric and the approximately orthogonal thin gate dielectric section 116C (FIG. 1, FIG. 3I), although example embodiments reduce such a potential as further detailed below. Insulating regions 308 (e.g., silicon nitride) also are formed above control gate CG, between the gate stack sidewall dielectrics 306. Following step 206, method 200 continues to step 208.

Figure 3H:
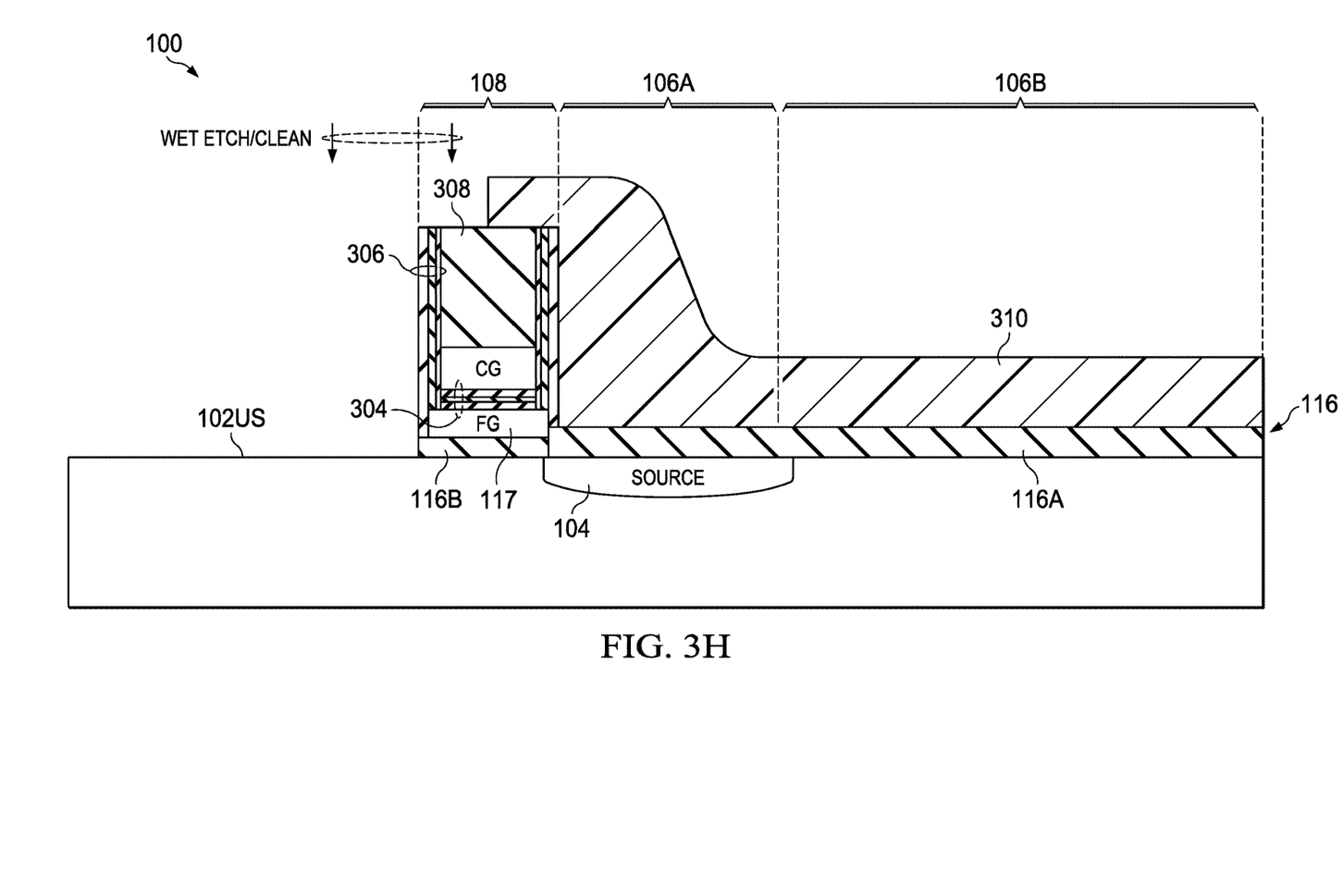
Figure 3I:
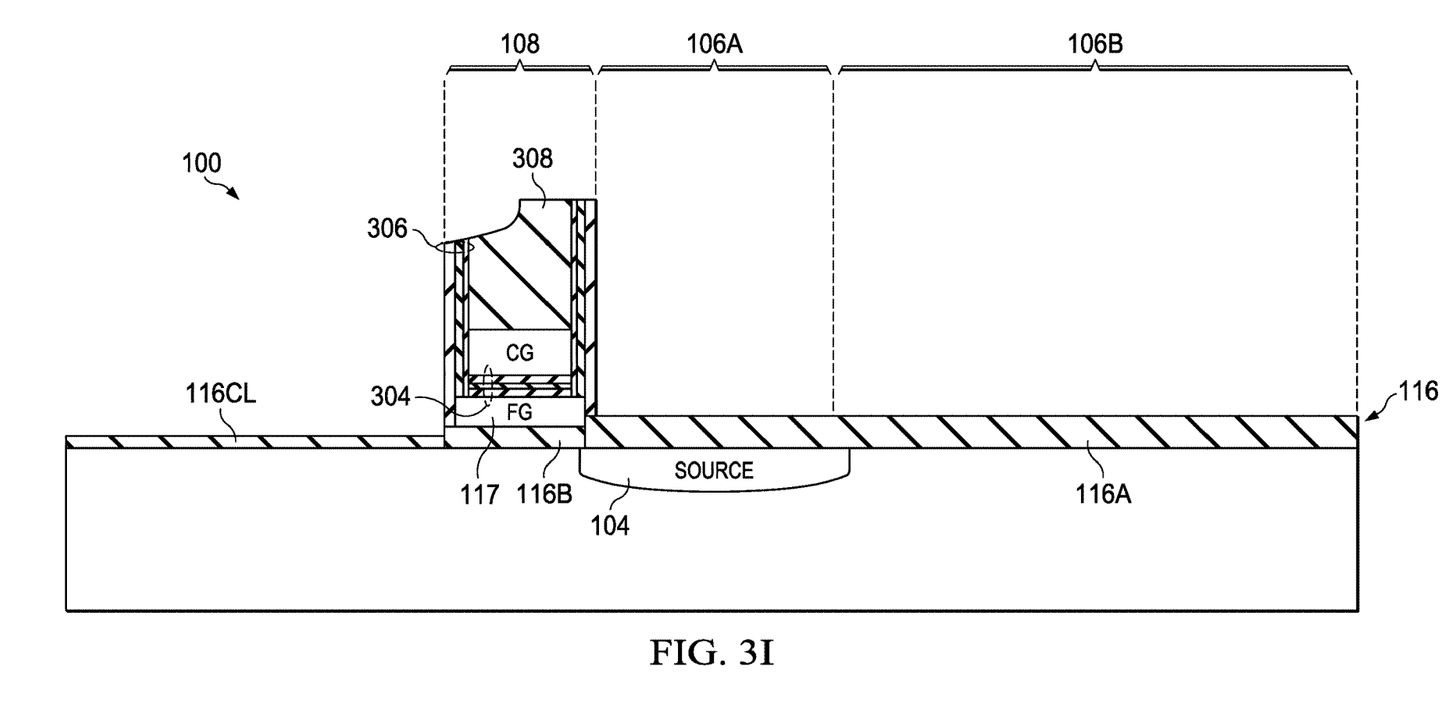

In step 208, a thin-thickness dielectric layer (e.g., again, gate oxide) is formed, as further shown in the illustrations of FIGS. 3H and 3I. In an example embodiment, thin-thickness dielectric layer formation does not follow the same steps as thick and medium dielectric layer formation in at least one sense, that is, it is performed without a plasma etch down toward the substrate upper surface 102US, as part of the thin dielectric formation. Indeed, it is contemplated that such an etch, whether all the way to surface 102 or if stopped prior to reaching the surface and leaving some remaining dielectric thickness (e.g., stopping at 55 Å thickness or larger), may render the resultant device vulnerable to programming disturb, as the etch may cause sub-surface damage into substrate 102 and also may compromise a portion (e.g., the lower portion) of sidewall dielectrics 306, either of which can facilitate charge leakage in those areas, leading to a program disturb. Accordingly, in an example embodiment, the previously-formed portion of medium-thickness layer 116BL (FIG. 3G), in the area where thin-oxide is desired, provides a sacrificial oxide layer in the area where a thin oxide section 116C (FIG. 1) is desired. Further, that sacrificial oxide layer is removed down to upper surface 102US by a technique other than dry (e.g., plasma) etch. In an example embodiment, a wet etch uses cleaning chemistries to remove the sacrificial oxide until the wet etch reaches upper surface 102US. Accordingly, in the illustrated example of FIG. 3G, the sacrificial oxide layer to be removed to create thin dielectric sections 116C is the remaining medium-thickness layer 116BL, beyond gate stack 108 (alternatively, however, a separate sacrificial oxide layer could be used). Thus, masking is first placed in at least part of locations other than the sacrificial oxide, which by way of example in FIG. 3H is the addition of a conformal mask 310 over a portion of the top, and continuing along one sidewall (and its dielectrics 306), of gate stack 108, and extending over the thick dielectric segment 116A in central area 106A and distal area 106B. Then, step 208 removes the sacrificial oxide layer, down to upper surface 102US, by the wet etch. Such chemistries may include, for example, dilute HF, but also can be executed also with NH4F or basic oxide etch (BOE) or similar chemistries. Accordingly, the sacrificial oxide layer (e.g., medium-thickness layer 116BL in FIG. 3G) is removed down to areas where thin oxides are to be formed, which is illustrated in FIG. 3H with the partial removal of medium-thickness layer 116BL, leaving medium-thickness section 116B under field gate FG and the partial exposure of a portion of upper surface 102US. Incidentally, an upper portion of insulating region 308 atop gate stack 108 and the upper corner of the exposed sidewall dielectric 306 also may be removed by the etch. Next, mask 310 is removed, and a thin dielectric layer is formed (e.g., grown) to a desired thickness, in any area of exposed semiconductor. By way of example, a thin dielectric layer may be in the range of 35 Å, or less, in thickness. Thus, given the area of exposed upper surface 102US in FIG. 3H, then FIG. 3I shows a dielectric layer 116CL as a thin-thickness dielectric, where the same identifier 116C is carried forward from FIG. 1, but an "L" is added to that reference as FIG. 3I illustrates a longer portion of layer 116CL, whereas FIG. 1 illustrates a dielectric section 116C that ultimately may be formed as a section taken (e.g., masked and etched) from layer 116CL. Further, the dielectric section 116C of thin dielectric layer 116CL may abut (e.g., a vertical edge of) the thicker dielectric of section 116B (below floating gate FG 117), with the interface at that abutment improved by the example embodiment methodology. Also at the same time thin dielectric is grown, dielectric growth also will occur to a lesser extent on formerly-masked and now exposed dielectric, but for purposes of drawing simplification, a thickness change is not shown there. Following step 208, method 200 continues to step 210.

In step 210, any remaining items associated with cell 100 are completed, as may be ascertained from FIG. 1 as well by one skilled in the art. For example and returning to FIG. 1, access gate AG 119 is formed, with appropriate conductive material, to abut thin dielectric section 116C and the outer surface of the adjacent, and generally orthogonal, sidewall dielectrics 306 (see, FIG. 3I). Accordingly, in later use of cell 100, access gate AG 119 is for receiving a voltage so as to responsively apply an electrical field to one or both of control gate CG and floating gate FG 117, which are both located opposite sidewall dielectrics 306 relative to access gate AG 119. LDD region 112 may be implanted at the outer edge of access gate AG 119, diffusing laterally in the channel and toward source 104. BL 110 also may be implanted. Additionally, with FIG. 3I illustrating a thin dielectric layer 116CL along upper surface 102US to the left of the figure, that thin dielectric also may be used, albeit separated from cell 100 by appropriate isolating structure 114 as shown in FIG. 1, to support low-voltage CMOS or other devices. In other words, masking to form thin dielectric layer 116CL in cell 100 also may be used to form additional thin dielectric layer 116CL for use at distant locations on the wafer as low-voltage CMOS gate oxides. Similarly, with FIG. 3I illustrating a medium thickness dielectric along upper surface 102US to the right of the figure, that medium thickness dielectric also may be used, again separated from cell 100 by appropriate isolating structure 114 as shown in FIG. 1, as a gate oxide layer for mid-voltage CMOS or other devices. Still further, while not shown, other layers (e.g., dielectric) may be formed, with conductive contacts therethrough (e.g., to BL 110). Lastly, as such additional items are formed, the process steps forming them may concurrently form components in low-voltage CMOS section 118 and middle-voltage CMOS section 120. In all events, one skilled in the art should now appreciate that on completion of such device(s), the benefits attributed to cell 100 in the formation of thin dielectric sections 116C also may be realized by other devices formed in connection with substrate 102.

Figure 4:
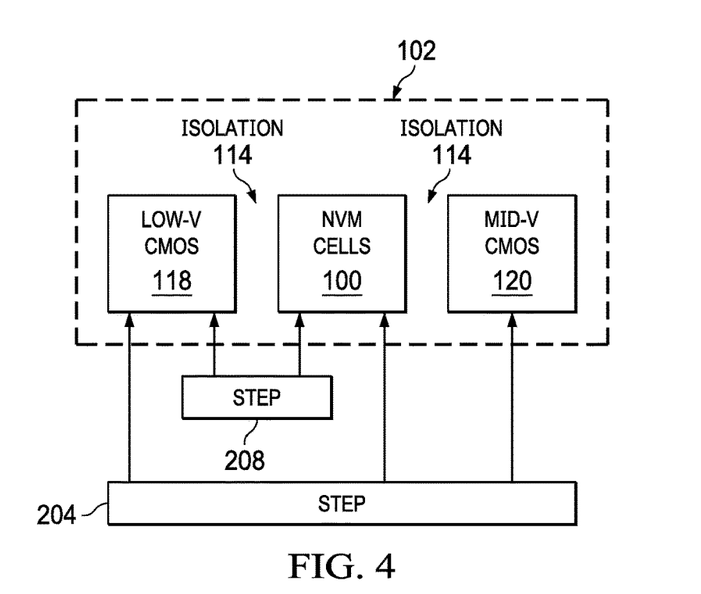
FIG. 4 is a diagrammatic view of a semiconductor substrate and the application of selected steps of the FIG. 2 method to different device regions of the substrate.

FIG. 4 is a diagrammatic view of semiconductor substrate 102, and the application of selected steps of method 200 (see, FIG. 2) thereto. In block form, FIG. 4 illustrates substrate 102 with three device blocks, corresponding to FIG. 1 and separated by isolating structures 114. The three regions are NVM cells 100, low-voltage CMOS devices 118, and mid-voltage CMOS devices 120. As introduced earlier, each of these blocks may be formed using some concurrent process steps of method 200 (and other steps ascertainable by one skilled in the art). The illustration of FIG. 4 is generally intended to depict the application of steps 204 and 208 from method 200, as those steps can concurrently apply to different device blocks on substrate 102.

FIG. 4 depicts that step 204 forms medium-thickness dielectric layers in all three device blocks. Accordingly, step 204 medium-thickness dielectric layering provides gate dielectrics for mid-voltage CMOS transistors 120 and gate stack dielectrics, below a floating gate FG 117 for NVM cells 100. Additionally, however, the medium-thickness layering provides a sacrificial layer for subsequently-formed thin oxides in NVM cells 100 and low-voltage CMOS 118. Accordingly, while integrated circuit fabrication may include numerous dielectric layers of varying thicknesses, eventually fabrication occurs of the circuit final two thinnest gate dielectrics, which earlier have been referred to as a medium thickness dielectric and a thin dielectric. For forming the medium thickness dielectric, therefore as the penultimate gate thickness for one set of gates on the device, in step 204 a mask is patterned and opened in areas to form the dielectric, and any existing dielectric in that opened area(s) is etched by a plasma etch down to a desired thickness followed by a wet etch, followed by growth of the medium-thickness (penultimate) dielectric. In an example embodiment, however, notably the areas opened for forming the medium thickness dielectric include not just areas/gates needing medium thickness oxides (shown in FIG. 4 as 120), but also gates needing thin dielectric devices (shown in FIGS. 4 as 100 and 118). For example, a particular semiconductor device may include, as its lowest two threshold-voltage devices, 1.8 voltage devices using medium thickness gate dielectrics as mid-voltage CMOS 120, and 1.2 voltage devices using thin gate dielectrics as low-voltage CMOS 118, with NVM cells 100 also using the same thin gate dielectrics. In this case, when the mask is opened to expose gate dielectric areas for the 1.8 voltage devices 120, it is concurrently opened to expose gate dielectric areas for the 1.2 voltage 118 and NVM cells 100, the etch/wet clean is performed, and the medium thickness dielectric is grown.

FIG. 4 further depicts that step 208 forms thin dielectric layers in blocks 100 and 118. Notably, however, thin gate formation does not include an additional dry etch and the potential charge disturb it can cause. Indeed, with gate stack formation between steps 204 and 208, then the lack of a step 208 dry etch thereby spares exposure of the gate stack dielectric sidewall and underlying substrate to such an etch. In connection with the earlier-formed step 204 sacrificial layer, there is a plasma etch, but recall may be stopped at or above some threshold thickness (e.g., 55 Å); so, an etch below that or some threshold could still cause some issue in the substrate area where access gate 108 will be formed. However, there is no dry etch for the ultimate thin dielectric layer, built after the penultimate dielectric layer, so in an example embodiment the access gate 108 sidewall, which is electrically sensitive in its subsequent function between an access gate and gate stack 108, is not subjected to plasma. Thus, the step 208 wet etch spares the vertical end of the gate stack floating gate oxide to a dry etch. Accordingly, step 208 provides the final or ultimate gate thickness formation for the device, during which the earlier-formed medium thickness dielectric for the penultimate (medium) gate thickness devices is used as a sacrificial dielectric removed by a wet etch for the ultimate (thin) gate thickness devices. Hence, thin-thickness dielectric layering may be formed in device blocks 100 and 118, so that such layering may be patterned and form appropriate sections, such as gate dielectrics for low-voltage CMOS transistors and access gate AG (or word line) dielectrics for NVM devices. In this regard, the thin dielectrics are formed without a plasma etch of the dielectric that immediately-precedes the location of thin dielectric, thereby avoiding possible plasma damage and correspondingly reducing possible data disturbs are realized for the NVM devices, while concurrently permitting low-voltage CMOS gate dielectrics to be formed. Thus, example embodiments provide various additional benefits, including the reduction, or avoided increase, in total process flow.

From the above, one skilled in the art should appreciate that example embodiments are provided for semiconductor fabrication, for example with respect to split gate memory cells. Such embodiments provide various benefits. For example, different portions of a semiconductor substrate may be processed at different times, so that certain process-created substrate-related dielectric layers (e.g., oxides) may be concurrently formed for different devices, with a favorable creation of thin dielectric layers in certain locations, while minimizing potential charge injection or cleaning damage to the surface of a semiconductor substrate. As a result, another benefit is a reduction in the possibility of programming disturb that might otherwise arise from semiconductor damage arising from pre-thin dielectric plasma etching. As another example, certain of the present teachings may apply to devices other than split cell memory. As a final example, additional modifications are possible in the described embodiments, and other embodiments are possible, within the scope of the following claims.

What is claimed is:

1. A method of forming an integrated circuit relative to a wafer comprising a semiconductor substrate, the method comprising:
   first forming a first dielectric layer having a first thickness and along the substrate, the first forming step comprising plasma etching the wafer in a first substrate area and a second substrate area and thereafter growing the first dielectric layer in the first substrate area and the second substrate area;
   after the first step, second forming a second dielectric layer having a second thickness and along the substrate in the second substrate area, the second thickness less than the first thickness, the second forming step comprising removal of the first dielectric layer in the second substrate area without plasma and until a surface of the substrate is exposed and growing the second dielectric layer in at least a portion of the surface; and
   further comprising, prior to the first forming step, a step of forming a third dielectric layer having a third thickness and along the substrate, the third thickness greater than the first thickness.

2. The method of claim 1 wherein the second forming step comprises removing the first dielectric layering in the second substrate area with a wet etch.

3. The method of claim 2 wherein the wet etch is selected from among a dilute HF, $NH_4F$, or a basic oxide etch.

4. The method of claim 1 and further comprising forming a non-volatile memory gate stack, with a portion of the first dielectric layer between the gate stack and the substrate.

5. The method of claim 4 and further comprising forming a non-volatile memory access gate, with a portion of the second dielectric layer between the access gate and the substrate.

6. The method of claim 1 wherein the first forming step comprises forming the first dielectric layer in a first region of the substrate for constructing non-volatile memory cells and concurrently in a second region of the substrate for constructing middle-voltage transistor cells.

7. The method of claim 6 and further comprising:
   forming a non-volatile memory cell gate stack oxide from the first dielectric layer; and
   forming a middle-voltage transistor gate oxide from the first dielectric layer.

8. The method of claim 1 wherein the second forming step comprises forming the second dielectric layer in a first region of the substrate for constructing non-volatile memory cells and concurrently in a second region of the substrate for constructing low-voltage transistor cells.

9. The method of claim 8 and further comprising:
   forming a non-volatile memory cell access gate dielectric from the second dielectric layer; and
   forming a low-voltage transistor gate dielectric from the second dielectric layer.

10. The method of claim 1 and further comprising:
    forming a gate dielectric from the second dielectric layer;
    forming a first gate conductor with the gate dielectric between the first gate conductor and the substrate; and
    forming a second gate conductor having a sidewall approximately orthogonal to the substrate and having a dielectric between the first gate conductor and the second gate conductor.

11. The method of claim 10 wherein the first gate conductor comprises an access gate conductor and wherein the second gate conductor comprises a floating gate conductor.

12. The method of claim 1 wherein the second forming step forms the second dielectric layer to abut the first dielectric layer.

13. The method of claim 1 wherein the third forming step comprises plasma etching the wafer in a third substrate area and thereafter growing the third dielectric layer in at least a portion of the third substrate area.

14. The method of claim 1 wherein the plasma etching of the first forming step comprises plasma etching a prior dielectric layer in the first substrate area such that a partial thickness of the prior dielectric layer remains on the substrate, followed by a wet removal of the partial thickness until a surface of the substrate is exposed in the first substrate area.

15. The method of claim 1 wherein the plasma etching of the first forming step comprises plasma etching a prior dielectric layer in the first substrate area until a surface of the substrate is exposed in the first substrate area.

16. The method of claim 1 and further comprising forming a non-volatile memory access gate, with a portion of the second dielectric layer between the access gate and the substrate.

17. The method of claim 1 and further comprising forming a non-volatile memory cell gate stack dielectric from the first dielectric layer.

18. The method of claim 1 and further comprising forming a non-volatile memory cell access gate dielectric from the second dielectric layer.

19. A method of forming an integrated circuit relative to a wafer comprising a semiconductor substrate, the method comprising:
   first forming a first dielectric layer having a first thickness and along the substrate, the first forming step comprising plasma etching the wafer in a first substrate area and a second substrate area and thereafter growing the first dielectric layer in the first substrate area and the second substrate area; and
   after the first step, second forming a second dielectric layer having a second thickness and along the substrate in the second substrate area, the second thickness less than the first thickness, the second forming step comprising removal of the first dielectric layer in the second substrate area without plasma and until a surface of the substrate is exposed and growing the second dielectric layer in at least a portion of the surface,
   wherein the plasma etching of the first forming step comprises plasma etching a prior dielectric layer in the first substrate area such that a partial thickness of the prior dielectric layer remains on the substrate, followed by a wet removal of the partial thickness until a surface of the substrate is exposed in the first substrate area.

20. A method of forming an integrated circuit relative to a wafer comprising a semiconductor substrate, the method comprising:
   first forming a first dielectric layer having a first thickness and along the substrate, the first forming step comprising plasma etching the wafer in a first substrate area and a second substrate area and thereafter growing the first dielectric layer in the first substrate area and the second substrate area;
   after the first step, second forming a second dielectric layer having a second thickness and along the substrate in the second substrate area, the second thickness less than the first thickness, the second forming step comprising removal of the first dielectric layer in the second substrate area without plasma and until a surface of the substrate is exposed and growing the second dielectric layer in at least a portion of the surface;
   forming a gate dielectric from the second dielectric layer;
   forming a first gate conductor with the gate dielectric between the first gate conductor and the substrate; and
   forming a second gate conductor having a sidewall approximately orthogonal to the substrate and having a dielectric between the first gate conductor and the second gate conductor.

* * * * *